United States Patent
Morooka et al.

[11] Patent Number: 6,040,520
[45] Date of Patent: Mar. 21, 2000

[54] SOLAR CELL AND METHOD OF MANUFACTURING THE SAME

[75] Inventors: Hisao Morooka, Yamanashi; Takamitsu Miura, Kanagawa; Hiroshi Yamada, Yamanashi; Katsuki Kurihara, Yamanashi; Mitsutaka Matsuse, Yamanashi; Yasuyuki Arai, Kanagawa, all of Japan

[73] Assignees: Semicondutor Energy Laboratory Co., Ltd., Kanagawa; TDK Corporation, Tokyo, both of Japan

[21] Appl. No.: 09/064,175

[22] Filed: Apr. 22, 1998

[30] Foreign Application Priority Data

May 16, 1997 [JP] Japan .................. 9-143078

[51] Int. Cl.[7] .................. H01L 31/045; H01L 31/0392
[52] U.S. Cl. .................. 136/245; 136/258; 136/261
[58] Field of Search .................. 136/245, 258, 136/261, 244, 252

[56] References Cited

U.S. PATENT DOCUMENTS

| | | | |
|---|---|---|---|
| 4,612,409 | 9/1986 | Hamakawa et al. | 136/244 |
| 4,773,942 | 9/1988 | Hamakawa et al. | 136/244 |
| 4,875,943 | 10/1989 | Hamakawa et al. | 136/244 |
| 5,127,964 | 7/1992 | Hamakawa et al. | 136/256 |
| 5,331,183 | 7/1994 | Sariciftci et al. | 257/40 |
| 5,419,781 | 5/1995 | Hamakawa et al. | 136/244 |
| 5,454,880 | 10/1995 | Sariciftci et al. | 136/263 |
| 5,538,902 | 7/1996 | Izu et al. | 437/2 |
| 5,626,686 | 5/1997 | Yoshida | 136/244 |
| 5,733,381 | 3/1998 | Ota et al. | 136/244 |

*Primary Examiner*—Nam Nguyen
*Assistant Examiner*—Michael C. Miggins
*Attorney, Agent, or Firm*—Eric J. Robinson; Nixon Peabody LLP

[57] ABSTRACT

In a solar cell including a photoelectric conversion layer 14 disposed on a flexible substrate 11 and constituted by a laminated layer of non-single crystalline silicon thin films, the flexible substrate 11 has a coefficient of linear thermal expansion of is 2.0 ppm to 10.0 ppm. By this, the coefficient of linear thermal expansion of the flexible substrate 11 and that of the photoelectric conversion layer 14 become close to each other, so that warp and deformation during manufacturing steps and after the steps are decreased. Further, since stress applied to the photoelectric conversion layer 14 is also lessened, the photoelectric conversion efficiency can be increased.

21 Claims, 2 Drawing Sheets

SOLAR CELL AND METHOD OF MANUFACTURING THE SAME

BACKGROUND OF THE INVENTION

1. Field of the Invention

The present invention relates to a flexible solar cell including a photoelectric conversion layer which is disposed on a flexible substrate and is constituted by a laminated layer of non-single crystalline silicon thin films.

2. Description of the Related Art

Solar cells have been vigorously developed as electric power resources for promoting saving energy. Among the solar cells, a solar cell including a photoelectric conversion layer constituted by mainly laminating non-single crystalline silicon thin films such as amorphous films, microcrystalline films, and polycrystalline films has a feature that it can be manufactured at low cost.

There is also known a flexible solar cell formed by using mainly an amorphous silicon thin film as a photoelectric conversion layer and using a flexible substrate.

Since a flexible solar cell is light in weight and can be freely bent, such application is conceivable that the solar cell is used to be stuck to clothes, a tent, or the like.

As a substrate having flexibility used for the flexible solar cell, in addition to a resin substrate of PET (polyethylene terephthalate), PEN (polyethylene naphthalate), polyimide, PES (polyether sulfide), or the like, a metal substrate of stainless is used.

The stainless substrate has merits that a substrate having strength such as tensile strength, which is higher than that of the resin substrate, can be obtained at low cost.

However, when the stainless substrate is used, there has been a case in which problems occur such that deformation is caused in the manufacturing steps, or a flexible solar cell after the manufacture is warped to the substrate side so that sticking to a flat region becomes difficult, and the solar cell looks unattractive as commodities.

SUMMARY OF THE INVENTION

An object of the present invention is, in a solar cell constituted by providing non-single crystalline silicon films on a substrate, to improve the flatness of the solar cell by decreasing deformation and warp caused during and after steps of manufacturing the solar cell.

In order to achieve the above object, according to an aspect of the present invention, a solar cell comprises a photoelectric conversion layer disposed on a flexible substrate and constituted by laminating non-single crystalline silicon thin films, and is characterized in that the coefficient of linear thermal expansion of the flexible substrate is 2.0 ppm/° C. to 10.0 ppm/° C.

According to another aspect of the present invention, a solar cell comprises a photoelectric conversion layer disposed on a flexible substrate and constituted by laminating non-single crystalline silicon thin films, and is characterized in that the flexible substrate is made of an alloy of iron and nickel, and the nickel content of the alloy is 30 wt % to 51 wt %.

According to a still another aspect of the present invention, a solar cell comprises a photoelectric conversion layer disposed on a flexible substrate and constituted by laminating non-single crystalline silicon thin films, and is characterized in that the flexible substrate is made of an alloy of iron and nickel, the coefficient of linear thermal expansion of the flexible substrate is 2.0 ppm/° C. to 10.0 ppm/° C., and the nickel content of the alloy is 30 wt % to 51 wt %.

The nickel content of the alloy is preferably 31 wt % to 41 wt %.

According to a still another aspect of the present invention, a solar cell comprises a photoelectric conversion layer disposed on a flexible substrate and constituted by laminating non-single crystalline silicon thin films, and is characterized in that the flexible substrate is made of an alloy of iron and nickel, and the nickel content of the alloy is controlled so that stress applied to the photoelectric conversion layer becomes low.

The present applicant has found that in a flexible solar cell including a photoelectric conversion layer constituted by non-single crystalline silicon thin films, if a substrate having a coefficient of linear thermal expansion of 2.0 ppm/° C. to 10 ppm/° C. (20° C.), preferably 2.0 to 5.0 ppm/° C. (20° C.) is used, warp and deformation after manufacture can be extremely decreased.

Moreover, the present applicant has found that when such a substrate is used, the photoelectric conversion efficiency of a manufactured flexible solar cell is improved by several % than a conventional flexible solar cell using a resin substrate or a stainless substrate.

These findings will be considered. First, in a non-single crystalline silicon thin film constituting a photoelectric conversion layer of a solar cell, as the ratio of crystalline components in the film is high, and the hydrogen content of the film is low, the coefficient of linear thermal expansion of the film approaches the coefficient of linear thermal expansion (2.3 ppm/° C. to 2.6 ppm/° C. (20° C.)) of the single crystal silicon (bulk).

It is presumed that the actual coefficient of linear thermal expansion of a non-single crystalline silicon thin film constituting a photoelectric conversion layer of a solar cell is about 2.5 to 5 ppm/° C. (20° C.).

Thus, for example, if a substrate having a coefficient of linear thermal expansion of 2.0 ppmn/° C. to 10.0 ppm/° C. (20° C.), especially 2.0 to 5.0 ppm/° C. (20° C.) smaller than the coefficient of linear thermal expansion of a resin substrate or a stainless substrate is used, the coefficient of linear thermal expansion of the substrate approaches that of a non-single crystalline silicon thin film.

As a result, deformation or warp caused by temperature change in heating of about 20 to 500° C. and subsequent cooling to room temperature during manufacturing steps of a non-single crystalline silicon thin film, is decreased. It is presumed that since stress becomes, hard to apply to the non-single crystalline silicon film, the original photoelectric conversion efficiency is obtained.

In other words, it is presumed that in a conventional substrate of resin, stainless, or the like, since the difference in the coefficient of linear thermal expansion is large between the substrate and the nonsingle crystalline silicon thin film, stress is applied to the non-single crystalline silicon thin film to produce lattice defects, cracks, and the like, so that the photoelectric conversion efficiency is lowered.

According to the present invention, in a solar cell including a photoelectric conversion layer constituted by non-single crystallire silicon thin films, it is possible to obtain a solar cell in which deformation and warp after manufacture is decreased and improved, and the photoelectric conversion efficiency is high.

As materials of a substrate applied for the present invention, any material is used as long as the coefficient of linear thermal expansion is 2.0 ppm/° C. to 10.0 ppm/° C. (20° C.), especially, 2.0 to 5.0 ppm/° C. (20° C.) and has properties suitable for manufacture of a solar cell.

Especially, it is preferable to use an alloy of iron and nickel, an alloy of iron, nickel, and cobalt, an alloy mainly containing nickel, a material mainly containing aramid resin, and the like.

Further, as a substrate of a flexible solar cell, the inventor of the present invention has found that if a substrate made of an alloy of iron and nickel in which the nickel content of the alloy is 30 wt % to 51 wt %, preferably 31 wt % to 41 wt % is used, deformation or warp of the flexible solar cell caused during the manufacturing steps or after the steps is extremely small, and the photoelectric conversion efficiency can be most effectively increased.

In addition, since the substrate made of the alloy of iron and nickel can be obtained at relatively low cost, it is possible to provide a solar cell having a little deformation and warp and having high photoelectric conversion efficiency at low cost.

Stress applied to a photoelectric conversion layer of a flexible solar cell is varied according to the property of a substrate and is not uniform. Thus, if an alloy of iron and nickel is used, and the nickel content of the alloy of iron and nickel is controlled so that the stress is made lowest, or is made optimum, it is possible to more effectively improve deformation and warp of the solar cell, and to improve the photoelectric conversion efficiency.

DETAILED DESCRIPTION OF THE PREFERRED EMBODIMENTS

Figure 1:
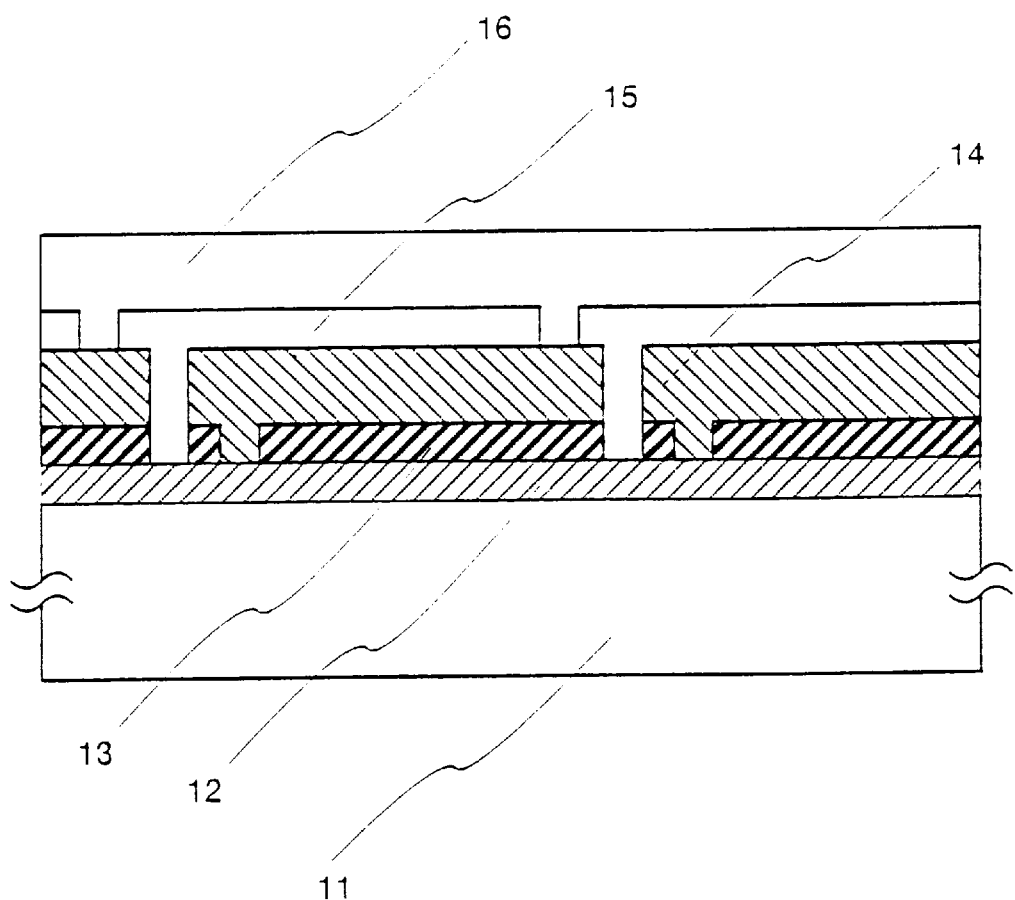
FIG. 1 is a view showing an example of a structure of a flexible solar cell.

FIG. 1 shows an example of a structure of a solar cell using the present invention.

In FIG. 1, an insulating film 12 made of resin or the like is disposed on a flexible substrate 11. A lower electrode 13, a photoelectric conversion layer 14, a transparent electrode 15, and a protective film 16 are laminated on the insulating film.

In the photoelectric conversion layer 14, non-single crystalline silicon films are laminated so as to have at least one NIP junction. For example, an N-layer, I-layer, and P-layer are laminated in this order.

In FIG. 1, it is also possible to form such a structure that the lower electrode 13 of a photoelectric conversion element constituted by the lower electrode 13, the photoelectric conversion layer 14, and the transparent electrode 15 is connected to the transparent electrode 15 of an adjoining photoelectric conversion element to form series connection so that an output voltage is increased.

The flexible substrate 11 is made of, for example, an alloy of iron and nickel. The coefficient of linear thermal expansion of this substrate is 4.0 to 4.7 ppm/° C. (30° C. to 300° C.). The thickness of the flexible substrate 11 is 50 to 300 μm, for example, 100 μm.

If such a substrate is used, deformation or warp caused during the manufacturing steps of the solar cell, or after the steps, is decreased and improved, and high photoelectric conversion efficiency is obtained.

Preferred embodiments of the present invention will next be described in more detail.

Embodiment 1

In this embodiment, an example in which a substrate made of an alloy mainly containing iron and nickel is used as a flexible substrate, will be described.

First, manufacturing steps of a flexible solar cell will be described.

Polyimide resin is applied to a flexible substrate 11 made of an alloy of iron and nickel (nickel content is 40%) and having a thickness of 100 μm so that an insulating film 12 with a thickness of about 200 μm is formed.

The coefficient of linear thermal expansion of this substrate is about 4.0 ppm/° C. (30° C. to 300° C.).

An aluminum thin film constituting a lower electrode is formed on the insulating layer 12 by a sputtering method. Thereafter, according to necessity, the aluminum thin film is patterned to form a lower electrode 13.

Next, a photoelectric conversion layer is formed. Here, by using a plasma CVD method, an N-layer, an I-layer, and a P-layer respectively made of an amorphous silicon thin film are laminated in this order to form the photoelectric conversion layer.

First, the N-layer is formed. The flow rate of a film forming gas, is such that $SiH_4$ is 1 to 100 sccm, here, 50 sccm; $H_2$ is 100 to 1,000 sccm, here, 500 sccm; and $PH_3$ is 1 to 50 sccm, here, 30 sccm.

Next, the I-layer is formed. The flow rate of a film forming gas is such that $SiH_4$ is 1 to 100 sccm, here, 50 sccm; $H_2$ is 100 to 1,000 sccm, here, 500 sccm; and $PH_3$ is 1 to 50 sccm, here, 30 sccm.

Next, the P-layer is formed. The flow rate of a film forming gas is such that $SiH_4$ is 1 to 100 sccm, here, 50 sccm; $H_2$ is 100 to 1,000 sccn, here, 500 sccm; and $B_2H_6$ is 1 to 50 sccm, here, 30 sccm.

$Si_2H_6$ may be used instead of $SiH_4$ so that the P-layer is made of a microcrystalline silicon thin film and an energy bandgap is increased to more effectively carry out photoelectric conversion.

The pressure, temperature, and input power at the film formation are made equal for the respective layers in this embodiment.

The pressure at the film formation is 0.01 to 2 Torr, here, 1 Torr; the film growth temperature is 20° C. to 450° C., here, 300° C.; and the input power is 1 to 2,000 W, here, 1,000 W.

As for the film thickness of the respective films, the N-layer is 50 nm, the I-layer is 1,000 nm, and the P-layer is 50 nm.

When the film growth temperature for the respective films is made as relatively high as 300° C., the separation of hydrogen from the films is accelerated.

Thereafter, a groove or an opening for connection is formed in the lower electrode 13 and the photoelectric conversion layer 14 by laser scribing or the like, an ITO (Indium Tin Oxide) film with a thickness of 100 nm is formed, and the film is patterned to form a transparent electrode 15, whereby a structure of series connection is obtained.

Further, an auxiliary electrode may be formed of a conductive metal of aluminum on the transparent electrode 15 to increase conductivity.

In the case where the structure of series connection is not provided, the insulating film 12 may be omitted. In this case, the flexible substrate 11 may be used as a lower electrode without providing even the lower electrode 13.

Thereafter, a transparent protective film 16 is formed of urethane resin so that the flexible solar cell is formed.

In the thus manufactured flexible solar cell, as compared with a solar cell using a stainless substrate with the same thickness, deformation or warp after manufacture is greatly decreased, and an almost flat state can be obtained.

Further, the photoelectric conversion efficiency ($E_{ff}$) is improved by about 5% as compared with that using a stainless substrate.

Embodiment 2

In this embodiment, there is shown an example in which in the manufacturing steps of the flexible solar cell of the embodiment 1, there is a change in the film growth temperature of the photoelectric conversion layer.

In this embodiment, in the manufacturing steps of the photoelectric conversion layer, the film growth temperature of the respective layers are 20° C. for the N-layer, 150° C. for the I-layer, and 300° C. for the P-layer. Other conditions are the same as those of the embodiment 1.

Even in the case where the film growth temperature is changed as in the above, deformation or warp of the substrate is hardly seen during the film growth step. Also in the finally manufactured solar cell, the same is the case.

On the other hand, in the case where stainless is used for a substrate, since the difference in the coefficient of linear thermal expansion between the photoelectric conversion layer and the substrate is large, for example, in the state where the substrate is heated to 300° C. for the growth of the P-layer, warp is caused at the side of the photoelectric conversion layer.

Embodiment 3

In this embodiment, there is shown an example in which in the flexible solar cell of the embodiment 1, the nickel content of the alloy of iron and nickel constituting the flexible substrate is changed.

The nickel content of the alloy of iron and nickel used as the substrate of the flexible solar cell is changed.

In the solar cell using the substrate in which the nickel content is in the range of 30 wt % to 51 wt %, as compared with the solar cell using a stainless substrate, the decrease of warp and the improvement of photoelectric conversion efficiency can be seen. The photoelectric conversion efficiency is improved by 3% or more.

Especially, in the solar cell using the alloy with the nickel content of 31 wt % to 41 wt %, the photoelectric conversion efficiency is improved by about 5%.

Embodiment 4

This embodiment shows an example in which for different photoelectric conversion layers, the nickel content in substrates made of an alloy of iron and nickel is controlled so that the substrates having coefficients of linear thermal expansion suitable for the respective layers are obtained.

The structure of the photoelectric conversion layer is different according to the characteristics required for a product. In order to effectively decrease the warp of a solar cell, or to sufficiently obtain the photoelectric conversion efficiency, it is necessary to change the coefficient of linear thermal expansion of a substrate in accordance with the difference of the structure of the photoelectric conversion layer.

On the other hand, the measurement of the coefficient of linear thermal expansion of the photoelectric conversion layer constituting the solar cell or stress applied to the flexible solar cell on the substrate is extremely difficult.

Then, in the solar cell using a substrate made of an alloy of iron and nickel, by changing the nickel content of the alloy, the optimum coefficient of linear thermal expansion of the substrate can be obtained without the foregoing measurement.

Figure 2:
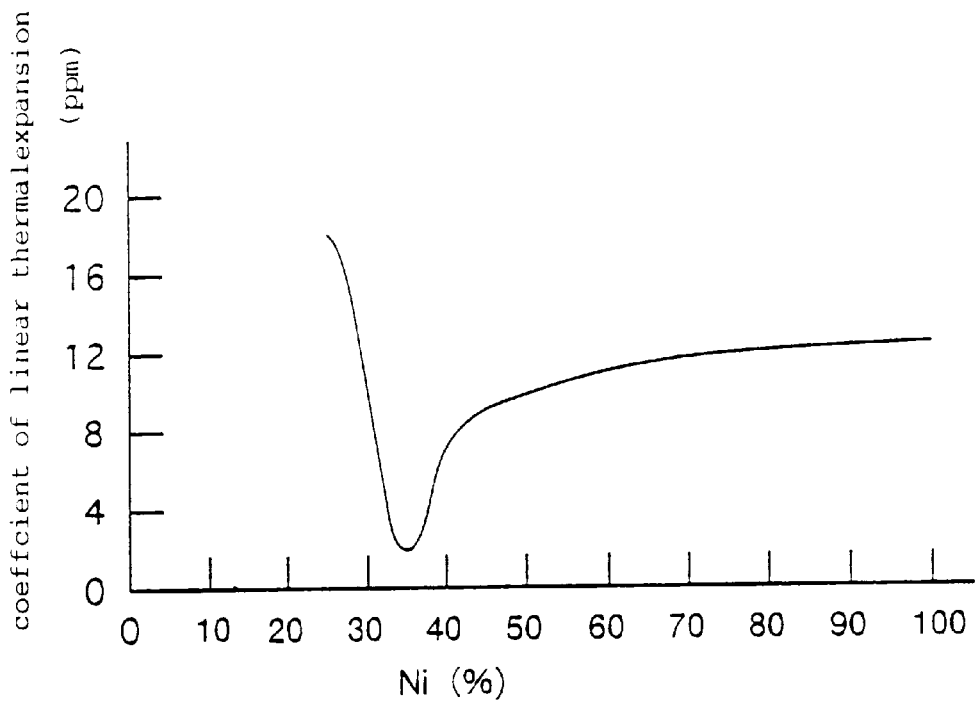
FIG. 2 is a graph showing the change of the nickel content of an alloy of iron and nickel and the coefficient of linear thermal expansion.

FIG. 2 is a graph showing the change of the coefficient of linear thermal expansion with respect to the nickel content of the alloy of iron and nickel.

Figure 3:
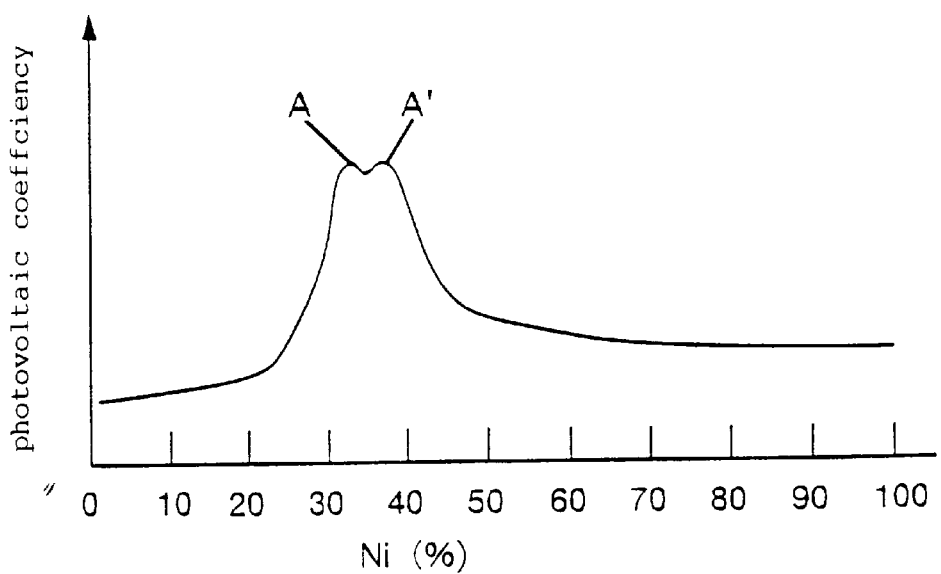
FIG. 3 is a view showing a model of the ratio of change of the photoelectric conversion efficiency of a solar cell when the nickel content of an alloy of iron and nickel is varied.

FIG. 3 is a view of a model showing the ratio of change of photoelectric conversion efficiency of a solar cell when the nickel content of an alloy of iron and nickel is changed.

As is apparent from FIG. 3, when the nickel content of the alloys of iron and nickel constituting the substrate is changed, stress applied to the photoelectric conversion layer is changed. Thus, the photoelectric conversion efficiency of the solar cell is changed.

There is a point where the photoelectric conversion efficiency becomes the highest, for example, point A, A'.

It is presumed that this point is a region where the coefficient of linear thermal expansion of the substrate and that of the photoelectric conversion layer become closest to each other. This measurement may be carried out by using the degree of warp as an index other than the photoelectric conversion efficiency, or both may be used.

It is also possible to estimate the coefficient of linear thermal expansion of the photoelectric conversion layer in view of the graph shown in FIG. 2 and the nickel content of the alloy of iron and nickel at points A, A'.

When the nickel content is made the rate shown at this point, the coefficient of linear thermal expansion of the substrate made of the alloy of iron and nickel can be made the optimum value so that the stress applied to the photoelectric conversion layer is made least, or sufficient performance and characteristics of a solar cell are obtained. As a result, the photoelectric conversion efficiency is increased, and deformation and warp can also be decreased.

In this manner, by controlling the nickel content of the alloy of iron and nickel, it is possible to more effectively improve the photoelectric conversion efficiency, and the deformation and warp.

That is, by controlling the nickel content of the alloy in accordance with the state of stress applied to the photoelectric conversion layer, a solar cell having superior performance can be easily manufactured.

The same is true also in the case where other alloy is used as a flexible substrate. That is, it is possible to obtain a substrate having an optimum coefficient of linear thermal expansion by changing the rate of a component having a controlling role for determination of a value of coefficient of linear thermal expansion, among components constituting an alloy.

In the alloy of iron and nickel, when the content of nickel is controlled, preferable stress characteristics can be obtained, sufficient flexibility can be obtained, and the strength can also be made high. In addition, the alloy is inexpensive. Thus, as materials for a flexible substrate to obtain a superior flexible solar cell, it can be said that the alloy of iron and nickel is one of the most preferable materials.

Embodiment 5

In this embodiment, a flexible substrate made of an alloy mainly containing iron, nickel, and cobalt is used as a substrate. Other structure is the same as the embodiment 1.

As an alloy mainly containing iron, nickel, and cobalt, KOVAR (made by Westinghouse Electric Corp. in US) is used in this embodiment. KOVAR mainly contains iron, and is constituted by nickel of 29 wt %, cobalt of 17 wt %, and other elements, such as manganese, cobalt, silicon, carbon, aluminum, magnesium, zinc, and titanium, of 0.2 wt % or less in total.

KOVAR has a coefficient of linear thermal expansion of about 4.5 to 5.1 ppm/° C. (30° C. to 400° C.), and 5.1 to 5.4 (30° C. to 450° C.).

In the flexible solar cell manufactured by using KOVAR as a substrate, as compared with a solar cell using a stainless substrate having the same thickness, the warp after manufacture is greatly decreased, and an almost flat state is obtained.

Further, the photoelectric conversion efficiency ($E_{ff}$) is improved by about 3% as compared with that using a stainless substrate.

Embodiment 6

In this embodiment, a flexible substrate mainly containing aramid resin is used as a substrate. Other structure is the same as the embodiment 1.

As a flexible substrate mainly containing aramid resin, in this embodiment, ARAMICA (made by Asahi Chemical Industry Co., Ltd., trade name registered by the company) is used.

Aramid resin is a superior material having both strength and low coefficient of linear thermal expansion. For example, ARAMICA has a coefficient of tensile elasticity of 1,100 (kg/mm$^2$) or more, and a coefficient of linear thermal expansion of about 7 ppm/° C. (20° C.).

In the flexible solar cell manufactured by using ARAMICA as a substrate, deformation during the manufacture and warp after the manufacture are hardly seen, and an almost flat state is obtained.

Further, the photoelectric conversion efficiency ($E_{ff}$) is improved by about 2% as compared with the solar cell using a stainless substrate.

As described above, according to the present invention disclosed in the present specification, in a flexible solar cell using a flexible substrate, warp can be decreased and photoelectric conversion efficiency can be improved.

What is claimed is:

1. A solar cell comprising a flexible substrate, and a photoelectric conversion layer disposed over the flexible substrate and constituted by a laminated layer of thin films comprising non-single crystalline silicon,
    wherein the flexible substrate has a coefficient of linear thermal expansion of 2.0 ppm/° C. to 10.0 ppm/° C.

2. A solar cell according to claim 1 wherein said flexible substrate comprises an alloy including nickel and iron.

3. A solar cell according to claim I wherein the coefficient of linear thermal expansion of said flexible substrate is within a range from 2.0 to 5.0 ppm/° C.

4. A solar cell comprising a flexible substrate, and a photoelectric conversion layer disposed over the flexible substrate and constituted by a laminated layer of thin films comprising non-single crystalline silicon,
    wherein the flexible substrate is made of an alloy comprising iron and nickel, and
    wherein a nickel content of the alloy is 30 to 51 wt %.

5. A solar cell according to claim 4 wherein the coefficient of linear thermal expansion of said flexible substrate is within a range from 2.0 to 5.0 ppm/° C.

6. A solar cell according to claim 4 wherein said alloy consists essentially of nickel and iron.

7. A solar cell comprising a flexible substrate and a photoelectric conversion layer disposed over the flexible substrate and constituted by a laminated layer of thin films comprising non-single crystalline silicon,
    wherein the flexible substrate is made of an alloy comprising iron and nickel,
    wherein the flexible substrate has a coefficient of linear thermal expansion of 2.0 ppm/° C. to 10.0 ppm/° C., and
    wherein a nickel content of the alloy is 30 wt % to 51 wt %.

8. A solar cell according to claim 7 wherein the coefficient of linear thermal expansion of said flexible substrate is within a range from 2.0 to 5.0 ppm/° C.

9. A solar cell according to claim 7 wherein said alloy consists essentially of nickel and iron.

10. A solar cell comprising a flexible substrate, and a photoelectric conversion layer disposed over the flexible substrate and constituted by a laminated layer of thin films comprising non-single crystalline silicon,
    wherein the flexible substrate is made of an alloy comprising iron and nickel, and a nickel content of the alloy is controlled in accordance with a state of stress applied to the photoelectric conversion layer, and wherein a nickel content of the alloy is 30 wt % to 51 wt %.

11. A solar cell according to claim 10 wherein the coefficient of linear thermal expansion of said flexible substrate is within a range from 2.0 to 10.0 ppm/° C.

12. A solar cell according to claim 10 wherein said alloy consists essentially of nickel and iron.

13. A method of manufacturing a solar cell comprising a flexible substrate and a photoelectric conversion layer disposed over the flexible substrate and constituted by a laminated layer of thin films comprising non-single crystalline silicon, said method comprising the steps of:
    using an alloy which comprises iron and nickel as the flexible substrate; and
    controlling a nickel content of the alloy in accordance with a state of stress applied to the photoelectric conversion layer, and wherein a nickel content of the alloy is 30 wt % to 51 wt %.

14. A solar cell comprising a flexible substrate, and a photoelectric conversion layer disposed over the flexible substrate and constituted by a laminated layer of thin films comprising non-single crystalline silicon,
    wherein the flexible substrate is made of an alloy comprising iron, nickel, and cobalt, and wherein the flexible substrate has a coefficient of linear thermal expansion of 2.0 ppm/° C. to 10.0 ppm/° C.

15. A solar cell according to claim 14 wherein said alloy consists essentially of iron, nickel and cobalt.

16. A solar cell according to claim 14 wherein a coefficient of linear thermal expansion of said flexible substrate is within a range from 2.0 ppm/° C. to 5.0 ppm/° C.

17. A solar cell comprising a flexible substrate, and a photoelectric conversion layer disposed over the flexible substrate and constituted by a laminated layer of thin films comprising non-single crystalline silicon,
    wherein the flexible substrate comprises aramid resin, and wherein the flexible substrate has a coefficient of linear thermal expansion of 2.0 ppm/° C. to 10.0 ppm/° C.

18. A photovoltaic conversion device comprising:
    an alloy substrate comprising nickel and iron;
    an insulating film formed on said alloy substrate;
    a photovoltaic conversion layer comprising non-single crystalline silicon formed over said insulating film,
    wherein a coefficient of linear thermal expansion of said alloy substrate is within a range from 2.0 to 10.0 ppm/° C.

19. A photovoltaic conversion device according to claim 18 wherein a thickness of said alloy substrate is 50 to 300 µm.

20. A photovoltaic conversion device according to claim 18 wherein said insulating film comprises a resin.

21. A photovoltaic conversion device according to claim 18 wherein said photovoltaic conversion layer comprises an N-type semiconductor layer, an I-type semiconductor layer, and a P-type semiconductor layer laminated over said insulating film.

* * * * *